United States Patent
Ishikawa et al.

(10) Patent No.: US 8,476,607 B2
(45) Date of Patent: Jul. 2, 2013

(54) CHARGED PARTICLE BEAM DRAWING APPARATUS AND ARTICLE MANUFACTURING METHOD

(75) Inventors: Tomonori Ishikawa, Utsunomiya (JP); Nobushige Korenaga, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 0 days.

(21) Appl. No.: 13/534,044

(22) Filed: Jun. 27, 2012

(65) Prior Publication Data
US 2013/0011797 A1 Jan. 10, 2013

(30) Foreign Application Priority Data
Jul. 8, 2011 (JP) .................................. 2011-151520

(51) Int. Cl.
*H01J 37/304* (2006.01)
(52) U.S. Cl.
CPC .................................... *H01J 37/304* (2013.01)
USPC .............................. 250/492.22; 250/442.11
(58) Field of Classification Search
USPC ........................ 250/492.22, 442.11
See application file for complete search history.

(56) References Cited

U.S. PATENT DOCUMENTS 6,304,320 B1 * 10/2001 Tanaka et al. ................... 355/73
7,230,257 B2 * 6/2007 Uchida .................... 250/492.22

FOREIGN PATENT DOCUMENTS
JP 9007538 A 1/1997
JP 2002184664 A 6/2002

* cited by examiner

*Primary Examiner* — Kiet T Nguyen
(74) *Attorney, Agent, or Firm* — Rossi, Kimms & McDowell LLP

(57) ABSTRACT

The drawing apparatus includes an optical system housing configured to emit a charged particle beam toward the substrate, a stage configured to hold the substrate and be moved at least in a direction perpendicular to an axis of the optical system housing, a detection device including a detector and a support for supporting the detector such that the detector faces a side surface of the stage, and configured for measuring a position of the stage, and a magnetic shield member provided to the stage and configured to shield an opening of the optical system housing that faces a top surface of the stage from a magnetic field. Here, the magnetic shield member is provided to the stage at a region, in a direction of the axis, other than a region where the detection device is provided.

7 Claims, 2 Drawing Sheets

CHARGED PARTICLE BEAM DRAWING APPARATUS AND ARTICLE MANUFACTURING METHOD

BACKGROUND OF THE INVENTION

1. Field of the Invention

The present invention relates to a charged particle beam drawing apparatus, and an article manufacturing method using the same.

2. Description of the Related Art

In recent years, as micronization of the element, increasingly complex circuit patterns, or a higher capacity of pattern data advance, the drawing accuracy of drawing apparatuses for use in the manufacturing of devices such as semiconductor integrated circuits need to be improved. As a method for realizing such requirements, a drawing apparatus that draws a pattern on a substrate by controlling the deflection scanning and blanking of a charged particle beam such as an electron beam or the likes is known. In the conventional drawing apparatus, when an exterior magnetic field invades into a charged particle optical system housing, a drawing error may occur due to the positional misalignment of a charged particle beam. Accordingly, Japanese Patent Laid-Open No. 2002-184664 discloses a charged particle beam exposure apparatus that shields an exterior magnetic field by providing a magnetic pole piece (magnetic shielding member: hereinafter referred to as "shielding member") on a stage on which a substrate is placed. On the other hand, Japanese Patent Laid-Open No. 09-7538 discloses a charged beam drawing apparatus using a plurality of charged particle beams in order to achieve improvements in throughput.

Here, in the exposure apparatus disclosed in Japanese Patent Laid-Open No. 2002-184664, a shielding member placed on a stage always needs to cover the opening of an optical system housing regardless of the position of the stage in association with the movement thereof. Thus, the planar dimension of the shielding member must be greater than the summation of the size of the opening of the optical system housing and the movement stroke of the stage during drawing processing. Also, the drawing apparatus measures the position of the stage with high accuracy using a laser interferometer. The head (detection device) of the interferometer of this type is typically supported from a support member positioning above the stage, via a strut, irradiates a mirror mounted on a side surface of the stage with a laser beam, and receives the laser beam reflected from the mirror. The interferometer head and the strut are disposed at positions so as not to be in contact with the stage which moves in association with drawing.

On the other hand, in the drawing apparatus disclosed in Japanese Patent Laid-Open No. 09-7538, the opening of the optical system housing increases in size due to the use of a plurality of charged particle beams. The planar dimension of the shielding member disclosed in Japanese Patent Laid-Open No. 2002-184664 needs to be greater than the summation of the size of the opening of the optical system housing and the stage stroke. Thus, when the shielding member disclosed in Japanese Patent Laid-Open No. 2002-184664 is applied to the drawing apparatus disclosed in Japanese Patent Laid-Open No. 09-7538, the planar dimension of the shielding member is greater than that of the stage. Here, as disclosed in Japanese Patent Laid-Open No. 2002-184664, when the shielding member is placed below the chuck, the interferometer needs to be placed such that the maximum distance between the interferometer and the mirror is greater than the distance of the stage stroke during drawing processing+(the planar dimension of the shielding member−the planar dimension of the stage)/2. The purpose for this is to avoid a collision between the interferometer or the strut and the shielding member. In other words, when the shielding member disclosed in Japanese Patent Laid-Open No. 2002-184664 is applied to the drawing apparatus disclosed in Japanese Patent Laid-Open No. 09-7538, the interferometer must be arranged spaced at least by the distance of (the planar dimension of the shielding member−the planar dimension of the stage)/2 as compared with the case of no application of the shielding member, resulting in an increase in footprint.

SUMMARY OF THE INVENTION

Accordingly, the present invention provides, for example, a drawing apparatus that is advantageous in both of magnetic field shield for a charged particle optical system housing and footprint.

According to an aspect of the present invention, a drawing apparatus that draws a pattern on a substrate using a charged particle beam is provided that includes an optical system housing configured to emit a charged particle beam toward the substrate; a stage configured to hold the substrate and be moved at least in a direction perpendicular to an axis of the optical system housing; a detection device including a detector and a support for supporting the detector such that the detector faces a side surface of the stage, and configured for measuring a position of the stage; and a magnetic shield member provided to the stage and configured to shield an opening of the optical system housing that faces a top surface of the stage from a magnetic field, wherein the magnetic shield member is provided to the stage at a region, in a direction of the axis, other than a region where the detection device is provided.

Further features of the present invention will become apparent from the following description of exemplary embodiments with reference to the attached drawings.

DESCRIPTION OF THE EMBODIMENTS

Figure 1A:
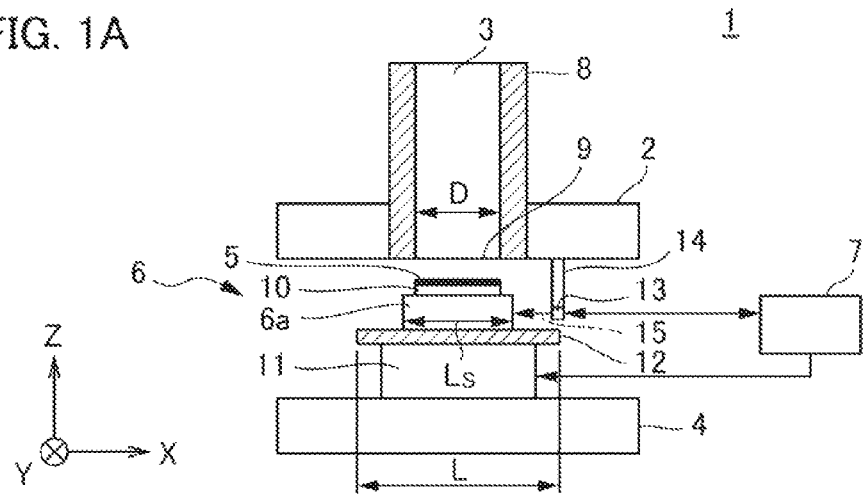
FIG. 1A is a diagram illustrating the configuration of a charged particle beam drawing apparatus according to a first embodiment of the present invention in a state where a substrate stage is at the center of a stroke.

Hereinafter, preferred embodiments of the present invention will be described with reference to the drawings.

(First Embodiment)

Firstly, a description will be given of a charged particle beam drawing apparatus (hereinafter referred to simply as "drawing apparatus") according to a first embodiment of the present invention. Hereinafter, each of the drawing apparatuses to be described in the following embodiments is intended to employ a multiple beam system in which a plurality of electron beams (charged particle beams) is deflected and the blanking (OFF of irradiation) of electron beams is independently controlled so as to draw predetermined drawing data on the predetermined position of a substrate to be treated. Here, a charged particle beam of the present embodiment is not limited to an electron beam, but may be other charged particle beams such as an ion beam. Also, the drawing apparatus of the present embodiment may use a single charged particle beam.

Figure 1B:
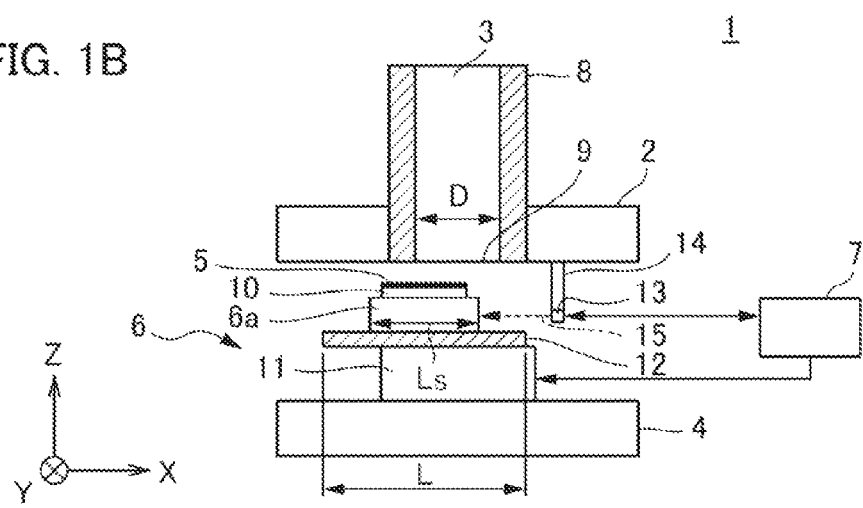
FIG. 1B is a diagram illustrating the configuration of the charged particle beam drawing apparatus according to the first embodiment of the present invention in a state where a substrate stage is at the left end of a stroke.
Figure 1C:
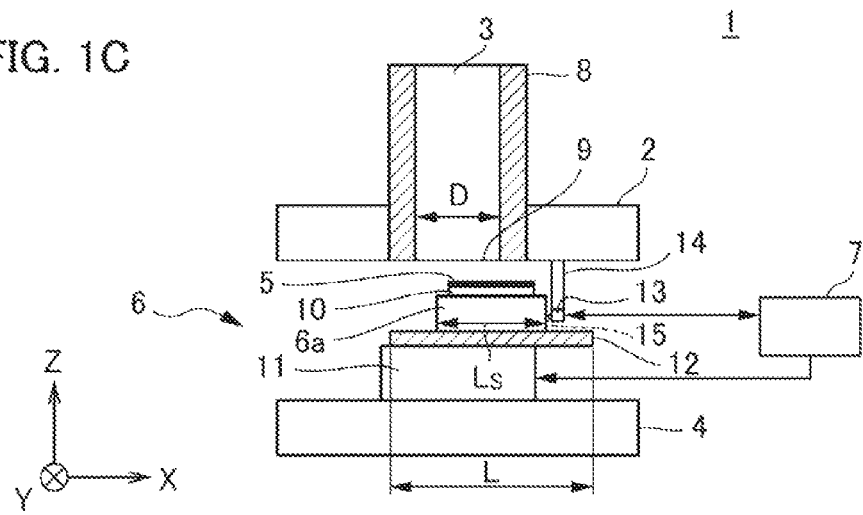
FIG. 1C is a diagram illustrating the configuration of the charged particle beam drawing apparatus according to the first embodiment of the present invention in a state where a substrate stage is at the right end of a stroke.

FIGS. 1A, 1B, and 1C are diagrams illustrating the configuration of a drawing apparatus according to the present embodiment. Also, in the following drawings, a description will be given in which the Z axis is in an irradiation direction of an electron beam to a substrate to be treated (the direction along the axis of an electron optical system housing (electron optical system barrel) 3 to be described below or the direction along the optical axis), and the X axis and the Y axis are mutually orthogonal to the direction perpendicular to the Z axis. In particular, FIG. 1A shows the state in which a substrate stage to be described below is at the center of a stroke in the X-Y direction during drawing processing, FIG. 1B shows the state in which the substrate stage is at the left end of a stroke in the X-Y direction, and FIG. 1C shows the state in which the substrate stage is at the right end of a stroke in the X-Y direction. A drawing apparatus 1 includes the electron optical system housing 3 that is held by a body support member (first support member, first surface plate) 2 supported from a floor via a support unit (not shown), and a substrate stage 6 that is held by a stage support member (second support member, second surface plate) 4 fixed to the floor and holds a substrate 5. Furthermore, the drawing apparatus 1 includes a controller 7 that controls the operation of the components of the drawing apparatus 1. Also, a substrate (substrate to be treated) 5 is a wafer consisting of, for example, single crystal silicon. A photosensitive resist is coated on the surface of the substrate 5.

The electron optical system housing (charged particle optical system housing, optical system housing) 3 includes a mechanism (not shown) therein, such as an optical system or the like, that splits an electron beam emitted from an electron gun and a crossover of the electron gun into a plurality of electron beams, and deflects and performs to imaging by the plurality of electron beams. Note that an electron beam is readily attenuated under an atmosphere at normal pressure and is also discharged under high voltage. In order to prevent such phenomena, the interior of the electron optical system housing 3 is held at a high vacuum by means of a vacuum exhaust system (not shown). Also, on the outer peripheral portion of the electron optical system housing 3, a cylindrical magnetic shield 8 that suppresses the invasion of the magnetic field into the electron optical system housing 3 is provided in order to prevent the positional shift of an electron beam under the influence of external magnetic field. Furthermore, an opening 9 having a diameter D is formed at the lower portion (electron beam emission side) of the electron optical system housing 3, and the electron beam is emitted through the opening 9 and is irradiated onto the substrate 5 placed on a substrate stage body 6a.

The substrate stage 6 includes, for example, an electrostatic attraction chuck 10 and the substrate stage body 6a that is movable at least in the X-Y direction while holding the substrate 5 using the chuck 10. Also, the substrate stage 6 includes a drive mechanism 11 that is fixed on the stage plate 4 at the lower portion of the substrate stage body 6a, and the substrate stage body 6a moves under the drive of the drive mechanism 11 as appropriate. The substrate stage 6 is also installed in a chamber (not shown). As in the interior of the electron optical system housing 3, the interior of the chamber is also held at a vacuum by means of a vacuum exhaust system (not shown). The degree of vacuum in the interior of the chamber may be relatively lower than that of the electron optical system housing 3. Furthermore, the substrate stage 6 includes a magnetic shield member 12 provided at the bottom surface (the drive mechanism 11 side) of the substrate stage body 6a. The magnetic shield member 12 shields a magnetic field so as to reduce the magnetic field to be invaded into the interior of the electron optical system housing 3 by passing through an opening 9. Consequently, the influence of the exterior magnetic field on an electron beam is suppressed. As the magnetic shield member 12, for example, a magnetic shielding plate formed of a high magnetic permeability material or a combination of a high magnetic permeability material and a high conductivity material may be employed. However, the configuration is not particularly limited as long as it exhibits the effect of shielding a magnetic field. Here, the magnetic shield member 12 installed at the substrate stage body 6a always needs to cover the opening 9 of the electron optical system housing 3, which is supported by the body plate 2, regardless of the position of the substrate stage body 6a in association with the movement thereof in the X-Y direction. In other words, the magnetic shield member 12 always needs to be positioned at a lower area corresponding to the opening area of the opening 9 in the Z direction. Accordingly, for example, the length dimension L of the magnetic shield member 12 in the X direction is set greater than the summation of the diameter D of the opening 9 and the X-direction stroke of the substrate stage 6 during drawing processing. Consequently, as shown in FIGS. 1A, 1B, and 1C, the length dimension L of the magnetic shield member 12 is longer than the length dimension $L_s$ of the substrate stage body 6a in the X direction.

Here, the drawing apparatus 1 further includes a detector 13 (also called a "head") of an interferometer that measures the position of the substrate stage 6 (the substrate stage body 6a) in the X-Y direction. The interferometer is a device that measures a distance by the interference of light. The detector 13 is supported by the body support member 2 positioned above the substrate stage 6 via a strut (support) 14. The detector 13 is directed toward the substrate stage 6. In the interferometer, a portion including the detector 13 and the strut 14 is also referred to as a "detection device". On the other hand, a mirror (not shown) is mounted on a side surface of the substrate stage body 6a and the interferometer performs position measurement by irradiating the mirror with a laser beam 15 by means of the detector 13 and receiving the laser beam 15 reflected from the mirror. In FIGS. 1A, 1B, and 1C, only the detector 13 for the X direction is shown but a detector for the Y direction is also present.

The controller 7 is constituted, for example, by a computer or the like and is connected to the components of the drawing apparatus 1 via a line to thereby execute control of the components in accordance with a program or the like. The controller 7 of the present embodiment includes various control systems that execute control of the electron gun and the optical system provided in the electron optical system housing 3, a control system that controls position measurement by the interferometer including the detector 13, and a control system that controls the operation of the substrate stage 6. Note that the controller 7 may be integrated with the rest of the drawing apparatus 1 (may be provided in a common case) or may be installed at a location separate from the location where the rest of the drawing apparatus 1 is installed (may be provided in another case).

Next, a detailed description will be given of the magnetic shield member 12 installed at the substrate stage body 6a. Firstly, as shown in FIG. 1B, assume that the substrate stage body 6a has moved to the left end in the X direction by the drive mechanism 11 during drawing processing. At this time, the distance from the right end of the substrate stage body 6a to the left end of the detector 13 is first set to be slightly greater than the X-direction stroke of the substrate stage body 6a and is also set to be slightly shorter than the distance of the X-direction stroke+(the planar dimension of the magnetic shield member 12−the planar dimension of the substrate stage body 6a)/2. In contrast, as shown in FIG. 1C, assume that the substrate stage body 6a has moved to the right end in the X direction by the drive mechanism 11 during drawing processing. In such a case, there is a slight gap between the right end of the substrate stage body 6a and the left end of the detector 13. This can be realized by the configuration in which the magnetic shield member 12 is provided at the lower portion of the substrate stage body 6a and the detector 13 is supported from above the substrate stage body 6a so as to face the mirror mounted on the side surface of the substrate stage body 6a. In other words, in the case of the conventional configuration in which a magnetic shielding member is arranged between the chuck 10 and the substrate stage body 6a, the magnetic shielding member is brought into contact with the detector 13 or the strut 14 if the substrate stage body 6a moves to the detector 13 side. According to the present embodiment, such contact can be avoided. For example, in practice, the maximum distance between the substrate stage body 6a and the detector 13 can be set to be substantially equal to the X-direction stroke of the substrate stage 6. Thus, as compared with the conventional configuration, the maximum distance becomes shorter by the distance of (the planar dimension of the magnetic shield member 12−the planar dimension of the substrate stage body 6a)/2. Thus, the magnetic shield member 12 can not only preferably shield the exterior magnetic field applied to the opening 9 but also can reduce footprint. Although a description has been given on the basis of the movement of the substrate stage in the X direction, the same applies to the case where the substrate stage moves in the Y direction.

As described above, the drawing apparatus 1 of the present embodiment is advantageous for ensuring magnetic field shielding for the electron optical system housing 3 and footprint.

(Second Embodiment)

Figure 2A:
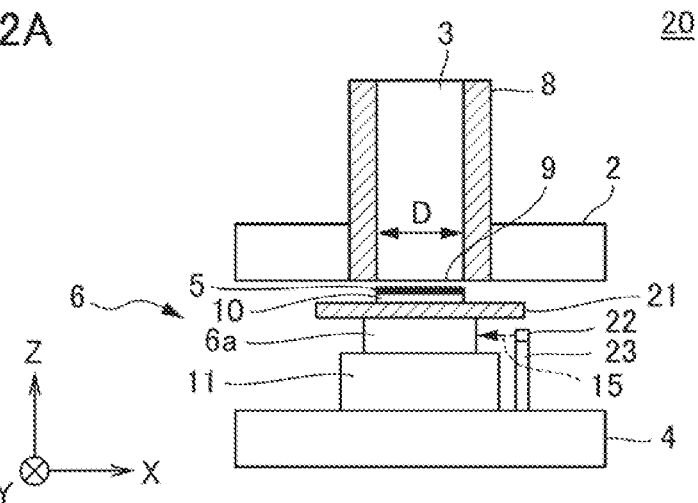
FIG. 2A is a diagram illustrating the configuration of a charged particle beam drawing apparatus according to a second embodiment of the present invention in a state where a substrate stage is at the center of a stroke.
Figure 2B:
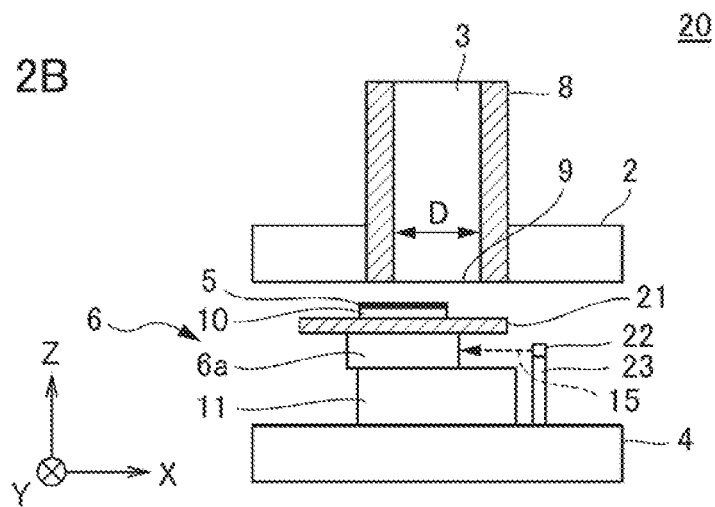
FIG. 2B is a diagram illustrating the configuration of the charged particle beam drawing apparatus according to the second embodiment of the present invention in a state where a substrate stage is at the left end of a stroke.
Figure 2C:
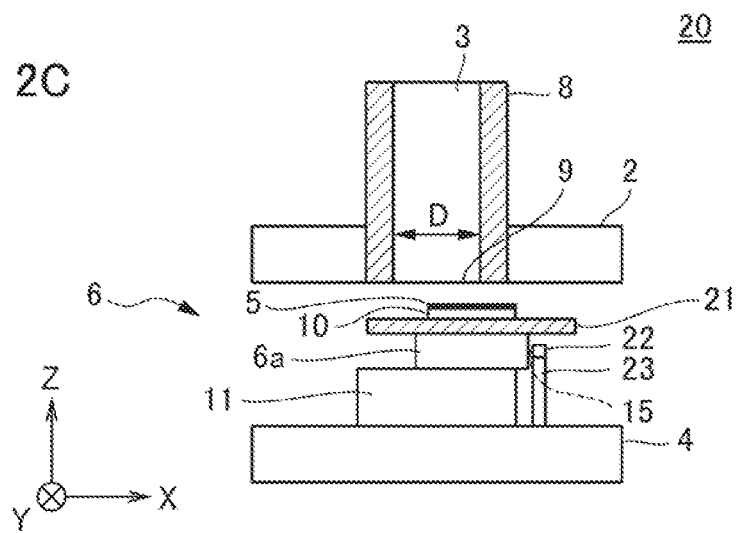
FIG. 2C is a diagram illustrating the configuration of the charged particle beam drawing apparatus according to the second embodiment of the present invention in a state where a substrate stage is at the right end of a stroke.

Next, a description will be given of a drawing apparatus according to a second embodiment of the present invention. FIGS. 2A, 2B, and 2C are diagrams illustrating the configuration of a drawing apparatus according to the present embodiment. The states shown in FIGS. 2A, 2B, and 2C correspond to those shown in FIGS. 1A, 1B, and 1C, respectively, according to the first embodiment, and the same elements as those shown in FIGS. 1A, 1B, and 1C are designated by the same reference numerals and explanation thereof will be omitted. A feature of the drawing apparatus 20 of the present embodiment lies in the fact that a magnetic shield member 21 is arranged between the chuck 10 and the substrate stage body 6a, that is, is arranged on the top surface of the substrate stage body 6a and a detector 22 is supported by the stage support member 4 via a strut 23. In this case, as shown in FIG. 2B and FIG. 2C, the detector 22 is supported by the stage support member 4 toward upward direction, i.e., extends from the underside of the substrate stage body 6a. Thus, the detector 22 does not enter the region of movement of the magnetic shield member 21. Therefore, the magnetic shield member 21 is not brought into contact with the detector 22 or the strut 23 upon movement of the substrate stage body 6a. As described above, according to the present embodiment, the same effects as those of the first embodiment may be obtained.

(Article Manufacturing Method)

An article manufacturing method according to an embodiment of the present invention is preferred in, for example, manufacturing a micro device, such as a semiconductor device or the like or an article such as an element or the like having a microstructure. The article manufacturing method may include the steps of forming, in a latent image pattern step (a step of drawing a pattern on a substrate), a latent image pattern on a substrate on which a photosensitizing agent is coated using the aforementioned drawing apparatus; and developing the substrate on which the latent image pattern has been formed in the latent image pattern step. Furthermore, the article manufacturing method may include other known steps (oxidizing, film forming, vapor depositing, doping, flattening, etching, resist peeling, dicing, bonding, packaging, and the like). The article manufacturing method of the present embodiment has an advantage, as compared with a conventional article manufacturing method, in at least one of performance, quality, productivity and production cost of an article.

While the embodiments of the present invention have been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-151520 filed on Jul. 8, 2011 which is hereby incorporated by reference herein it its entirety.

What is claimed is:

1. A drawing apparatus that performs drawing on a substrate with a charged particle beam, the apparatus comprising:
   an optical system housing configured to emit a charged particle beam toward the substrate;
   a stage configured to hold the substrate and be moved at least in a direction perpendicular to an axis of the optical system housing;
   a detection device including a detector and a support for supporting the detector such that the detector faces a side surface of the stage, and configured for measuring a position of the stage; and
   a magnetic shield member provided to the stage and configured to shield an opening of the optical system housing that faces a top surface of the stage from a magnetic field,
   wherein the magnetic shield member is provided to the stage at a region, in a direction of the axis, other than a region where the detection device is provided.

2. The apparatus according to claim 1, further comprising:
   a first support member configured to support the optical system housing,
   wherein the support is supported by the first support member and the magnetic shield member is provided to a bottom surface of the stage.

3. The apparatus according to claim 1, further comprising:
   a second support member configured to support the stage, wherein the stage includes a chuck and a stage body for supporting the chuck, the support is supported by the second support member, and the magnetic shield member is provided to a top surface of the stage body.

4. The apparatus according to claim 1, wherein the magnetic shield member includes a magnetic shield plate.

5. The apparatus according to claim 1, wherein the detector is configured to irradiate the side surface with light, and to detect light reflected from the side surface.

6. The apparatus according to claim 1, wherein the optical system housing is configured to emit a plurality of the charged particle beams toward the substrate.

7. A method of manufacturing an article, the method comprising:
   performing drawing on a substrate using a drawing apparatus;
   developing the substrate on which the drawing has been performed; and
   processing the developed substrate to manufacture the article,
   wherein the drawing apparatus performs the drawing on the substrate with the charged particle beams, the apparatus comprising:
      an optical system housing configured to emit a charged particle beam toward the substrate;
      a stage configured to hold the substrate and be moved at least in a direction perpendicular to an axis of the optical system housing;
      a detection device including a detector and a support for supporting the detector such that the detector faces a side surface of the stage, and configured for measuring a position of the stage; and
      a magnetic shield member provided to the stage and configured to shield an opening of the optical system housing that faces a top surface of the stage from a magnetic field,
   wherein the magnetic shield member is provided to the stage at a region, in a direction of the axis, other than a region where the detection device is provided.

* * * * *